(12) United States Patent
Hulbert

(10) Patent No.: US 8,217,656 B2
(45) Date of Patent: Jul. 10, 2012

(54) MOTION COMPENSATION IN MAGNETIC RESONANCE IMAGING

(75) Inventor: Anthony Peter Hulbert, Southampton (GB)

(73) Assignee: Siemens Aktiengesellschaft, Munich (DE)

( * ) Notice: Subject to any disclaimer, the term of this patent is extended or adjusted under 35 U.S.C. 154(b) by 443 days.

(21) Appl. No.: 12/612,856

(22) Filed: Nov. 5, 2009

(65) Prior Publication Data

US 2010/0119138 A1 May 13, 2010

(30) Foreign Application Priority Data

Nov. 12, 2008 (GB) .................................. 0820685.6
Mar. 5, 2009 (GB) .................................. 0903723.5

(51) Int. Cl.
*G01V 3/00* (2006.01)

(52) U.S. Cl. ..................... 324/322; 324/318; 324/314

(58) Field of Classification Search .................. 324/322, 324/318, 314, 309, 307, 300
See application file for complete search history.

(56) References Cited

U.S. PATENT DOCUMENTS

| 7,323,876 B2 * | 1/2008 | Den Boef ....................... 324/322 |
| 7,365,543 B2 | 4/2008 | Yui et al. |
| 7,391,214 B2 * | 6/2008 | Adachi .......................... 324/318 |
| 7,903,020 B2 * | 3/2011 | Lin et al. .......................... 342/22 |
| 8,030,931 B2 * | 10/2011 | Hulbert .......................... 324/322 |
| 8,129,992 B2 * | 3/2012 | Cork et al. ...................... 324/318 |
| 8,138,761 B2 * | 3/2012 | Evans ........................... 324/318 |
| 2003/0102864 A1 | 6/2003 | Welch et al. |
| 2005/0270025 A1 | 12/2005 | Nozaki et al. |
| 2008/0310696 A1 | 12/2008 | Hwang |

\* cited by examiner

*Primary Examiner* — Louis Arana
(74) *Attorney, Agent, or Firm* — Schiff Hardin LLP

(57) ABSTRACT

In a method of compensating for the effects of motion of an image subject during magnetic resonance imaging using phase encoding in a magnetic resonance imaging system having a number of wireless local coils and a wireless microwave transceiver array, one or more phase encoding steps are implemented to derive one or more magnetic resonance signals in the wireless coils. The signals from the phase encoding steps are upconverted to generate upper and lower sidebands of the magnetic resonance signals; and the upconverted upper and lower sideband signals are transmitted to the microwave array. Signals are derived from the upper and lower sidebands; and a representative phase difference between the signals derived from the upper and lower sidebands is determined from one or more of the phase encoding steps; then the representative phase difference is applied to each pair of derived signals for every phase encoding step to produce phase compensated signal pairs; such that the pair of signals are moved more closely into phase.

13 Claims, 4 Drawing Sheets

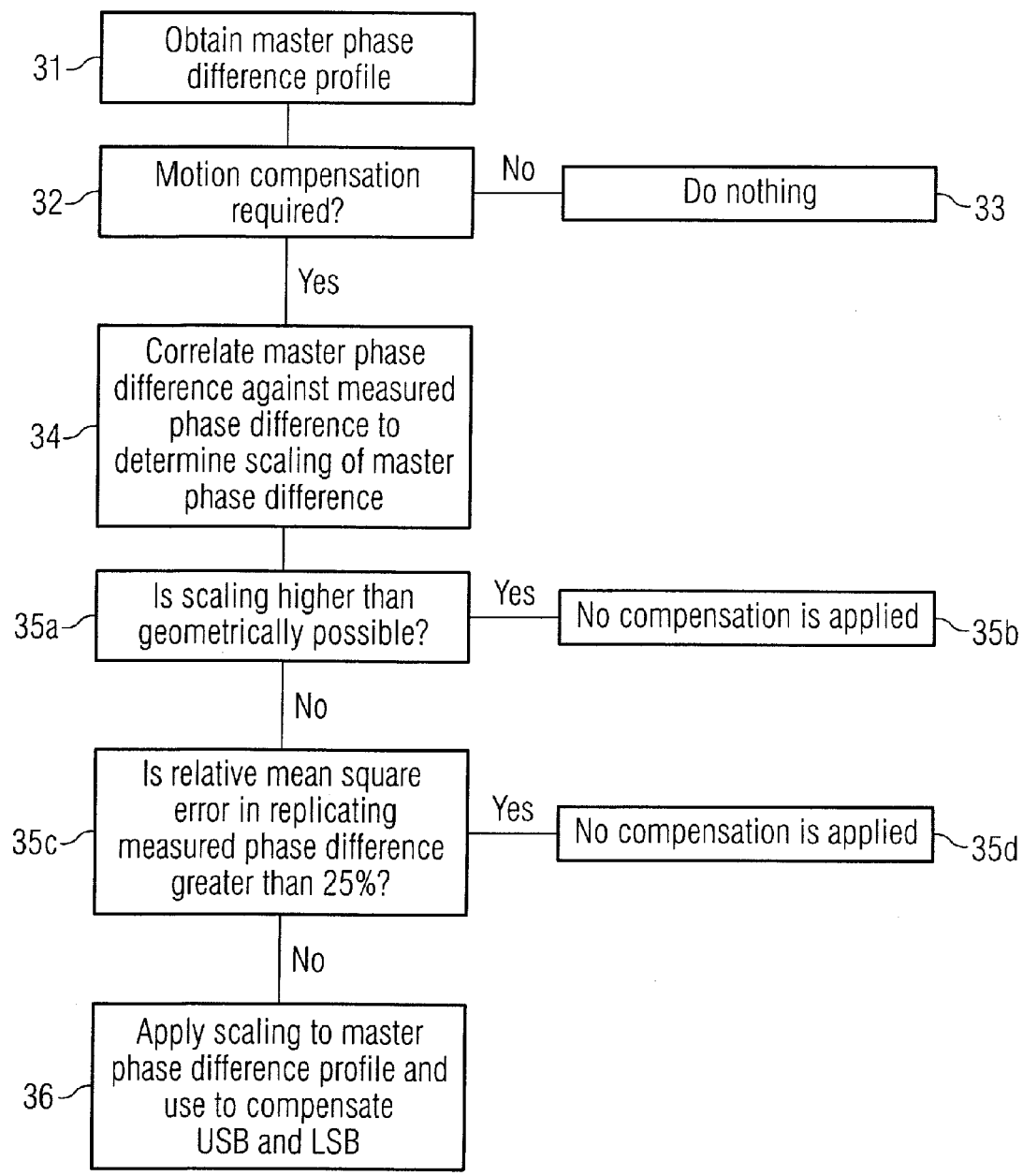

MOTION COMPENSATION IN MAGNETIC RESONANCE IMAGING

RELATED APPLICATIONS

The present application is related to the following applications filed simultaneously herewith: Ser. Nos. 12/612,831, 12/612,842 now issues as U.S. Pat. No. 8,138,761, Ser. No. 12/613,004 now issued as U.S. Pat. No. 8,129,992, Ser. No. 12/613,033 now issued as U.S. Pat. No. 8,030,931 and Ser. No. 12/613,082.

BACKGROUND OF THE INVENTION

1. Field of the Invention

The present invention relates to a method of compensating for the effects of motion of an image subject during magnetic resonance imaging (MRI) using phase encoding in a magnetic resonance imaging system.

2. Description of the Prior Art

Current MRI systems (also known as MRI scanners) employ arrays of local radio frequency (RF) receiver coils mounted in close proximity to the scanned patient to receive the RF with maximum possible signal to noise ratio (SNR). The coils that receive signals from the lower side of the patient are mounted in a patient table, upon which the patient lies. RF receiver coils that receive signals from the upper side of the patient are typically arranged into 'blankets' that are placed over the patient during imaging. The blanket is typically connected to a flexible cable containing one co-axial line for each RF receiver coil. The cables may interact with the rotating RF magnetic field (B1) and with the RF signals emitted due to magnetic resonance within the patient. In an attempt to mitigate these interfering effects, it is known to provide high impedance sections, known as 'traps' at regular intervals, typically $\lambda/8$, where $\lambda$ is the wavelength of the RF signals of interest. The traps add cost and inconvenience to the structure.

In use, the requirement to connect the cables and sterilize them between scanning one patient and the next leads to increased down-time between scans. It is therefore very attractive to develop a concept that permits the cables to be eliminated by a wireless solution. Ideally, the wireless solution substantially satisfies all the requirements of the existing system, particularly with regard to noise.

The wireless coils concept involves upconverting the Larmor frequency MR signal received by the local coils to a much higher frequency in the 2.4 GHz band. The upconverted signal is transmitted across a short radio path to an array of receive antennas and receivers that line the bore. Movement of the patient during a scan will vary the length of the radio paths, resulting in changes in amplitude and phase. The local oscillator frequency is much higher than the Larmor frequency, (typically about 40 times for a 1.5 T scanner), so the effect of the movement on phase is greatly magnified. For example, at 2.45 GHz, a 5 mm change in path length corresponds to a phase shift of 15°. However, the effect is greater than this, because the upconversion is performed using a local oscillator signal that has been transmitted from the bore antennas to the patient. Thus, the change in path length will also alter the local oscillator signal path. The combined effect is therefore to double the impact of patient movement—thus a 5 mm change in path length will correspond to a phase shift of 30°.

SUMMARY OF THE INVENTION

In accordance with the present invention, a method of compensating for the effects of motion of an image subject during magnetic resonance imaging using phase encoding in a magnetic resonance imaging system having a number of wireless local coils and a wireless microwave transceiver array includes the following steps. At least one phase encoding step is implemented to derive one or more magnetic resonance signals in the wireless coil, the signals from the phase encoding steps are upconverted to generate upper and lower sidebands of the magnetic resonance signals. The upconverted upper and lower sideband signals are transmitted to the microwave array. Signals are derived from the upper and lower sidebands and a representative phase difference between the signals derived from the upper and lower sidebands is determined from one or more of the phase encoding steps. The representative phase difference is applied to each pair of derived signals for every phase encoding step to produce phase compensated signal pairs so that the pair of signals are moved more closely into phase.

The present invention provides a method of processing the received data such that motion of the patient during imaging is compensated.

In one embodiment, the production of phase compensated signal pairs further includes moving the signals derived from the lower sideband more closely into phase with the signals derived from the upper sideband by multiplying complex signal representations of the signals derived from the lower sideband by a unity length phasor with phase equal to the representative phase difference.

In another embodiment, the production of phase compensated signal pairs further includes moving the signals derived from the upper sideband more closely into phase with the signals derived from the lower sideband by multiplying complex signal representations of the signals derived from the upper sideband by a unity length phasor with phase equal to minus the representative phase difference.

In another embodiment, the production of phase compensated signal pairs further includes moving the signals derived from the upper sideband more closely into phase with the signals derived from the lower sideband by multiplying complex signal representations of the pairs of signals derived from the upper sideband and lower sideband by unity length phasors with phases whose difference sums to the representative phase difference.

Preferably, the method further includes estimating a phase difference between the signal pairs derived from the upper sideband and lower sideband for each of the phase encoding steps.

Preferably, estimating the phase difference for every value comprises multiplying the upper sideband values by a conjugate of the lower sideband values; applying a 2 D filter to the multiplied values; determining a change in phase difference from row to row; calculating the argument of each element of each change in phase difference; and performing a cumulative sum of the arguments.

The sideband values used are those obtained in any of the three different embodiments.

Preferably, the estimation further comprises applying a 2-D filter to the cumulated sum.

Preferably, the method further comprises bringing the signal pairs into phase for each of the phase encoding steps.

Preferably, the signal pairs are brought into phase for each of the phase encoding steps by multiplying the complex signal representations of the phase compensated signal derived from the upper sideband by a unity length phasor with phase equal to plus one half of the estimated phase difference for that phase encoding step and multiplying the complex signal representation of the phase compensated signal derived from the lower sideband by a unity length phasor with phase equal to minus one half of the estimated phase difference for that phase encoding step.

Preferably, the phase compensated signal pairs are summed.

Preferably, the method further comprises measuring the ratio of the powers of the phase compensated signal pairs; and applying scaling to the signals, based on the square root of the power ratio, to produce a pair of power scaled signals, having equal powers prior to summation.

Preferably, the method further comprises generating and applying angle weights.

Preferably, the step of generating and applying angle weights comprises summing all mod-square phase encoding values corresponding to each line in the phase encoding direction; performing moving average filtering of the sum; and normalizing the filtered sum multiples.

BRIEF DESCRIPTION OF THE DRAWINGS

FIG. 4 is a flow diagram of additional steps to the method of FIG. 3.

DESCRIPTION OF THE PREFERRED EMBODIMENTS

The wireless concept to which the features of the present invention apply is based on upconversion of the RF (Larmor) frequency signals to microwave frequencies and transmission from local coils located in the patient blanket to microwave antennas located on the bore of the scanner. The combination of transmit and receive antennas on the patient and bore respectively constitutes a MIMO (Multiple Input/Multiple Output) system that allows individual signals from the patient antennas to be resolved. A wireless system greatly enhances the utility of MRI scanners by removing the requirement for cable connections to patient coils and gives rise to significant work flow benefits from eliminating the need to sterilize, connect and disconnect the cables. With substantially no reduction of bore size, an increased coil density above the current norms may be achieved, as well as improving scanner workflow. The present invention relates to a method of compensating for motion of the patient between successive scans to generate images using the wireless scanner arrangement.

Figure 1:
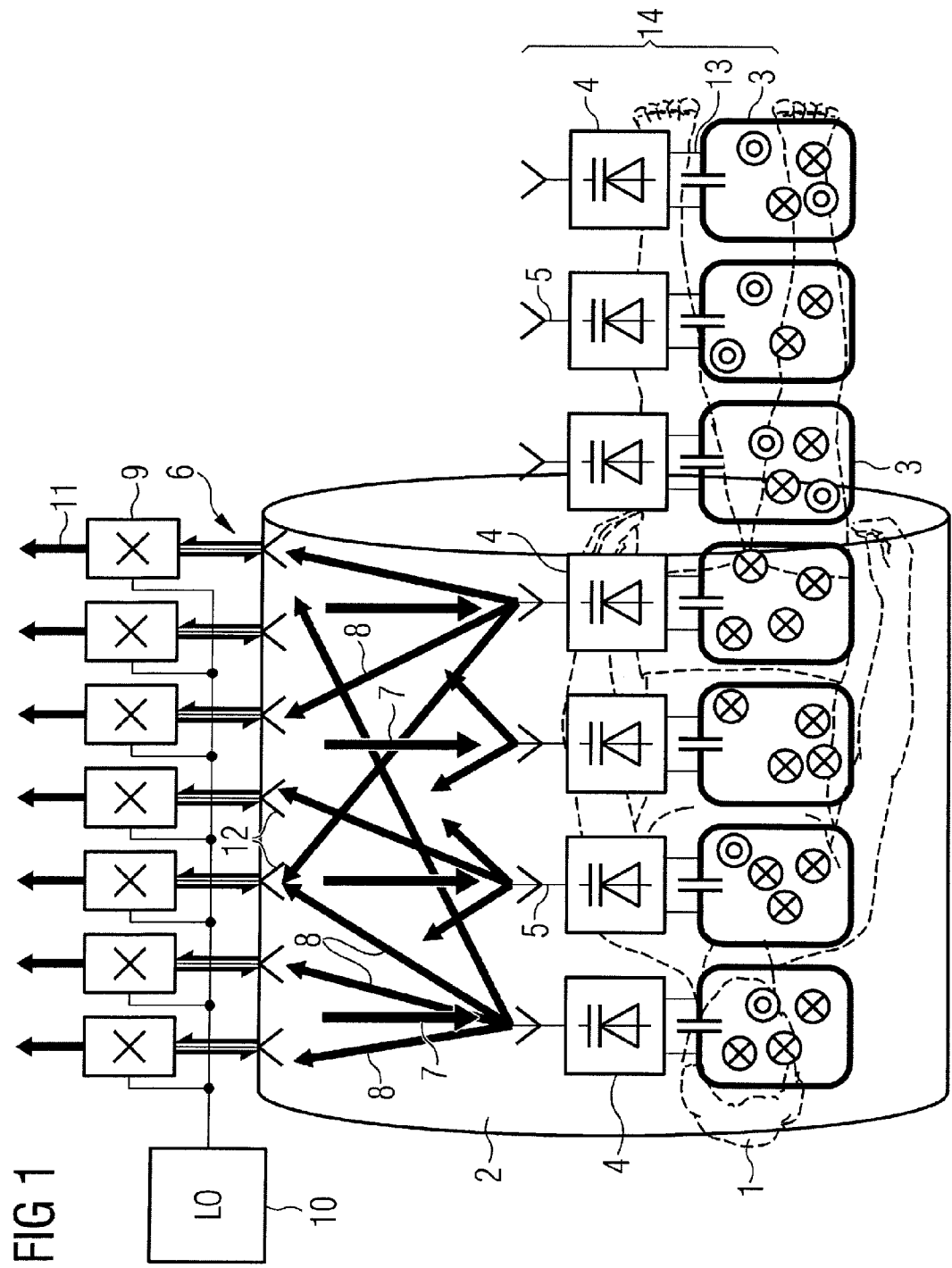
FIG. 1 illustrates a wireless MRI system incorporating a receiver operating in accordance with the present invention.

FIG. 1 shows a patient 1 within an MRI scanner bore tube 2. The bore 2 is an open cylindrical tube within a tubular cylindrical magnet, itself retained within a tubular cylindrical cryogen vessel, as well known to those familiar with the art. The tubular cylindrical magnet provides a high-strength homogeneous magnetic field $B_0$ in an imaging region. The magnets, cryogen vessel and various support and ancillary equipment are not shown in FIG. 1, being well known in the art and of no direct relevance to the present invention.

A blanket covers the patient and embedded in the blanket are a plurality of local coils 3. Each local coil 3 has an associated upconverter 4 and microwave antenna 5. Transceivers 9 comprising microwave receivers and down converters are connected to an array 6 of antennas 12 integrated into the scanner bore 2. The frequency upconverter 4 for each patient mat coil 3 produces signals for transmission to the array of transceivers 9 in the scanner bore 2. For the example of a 1.5 Tesla magnet, a local oscillator signal at around 2.4 GHz generated in a separate LO 10 and launched from the transceivers 9, via an antenna 12 of the antenna array 6, feeds the antenna array 6 to illuminate the patient coil electronics 14 with a signal 7 at the local oscillator frequency. The same local oscillator signal in the transceivers 9 converts the microwave signals 8, received from the patient coils 3 at the LO frequency±63 MHz, back to the original magnetic resonance (MR) frequency of 63 MHz for input 11 to the MR receivers (not shown). The local coil upconverters 4 are based on parametric amplifiers and implement low noise frequency conversion and amplification in simple, low cost circuitry. The parametric amplifiers use the incident local oscillator signal 7 to provide the frequency reference and the power for the upconversion. MR signals 13 from the coils are thereby converted to microwave frequency and transmitted to the bore transceiver antenna array 6.

While it is known that the MRI scanner bore is naturally a multipath-rich environment, it is assumed throughout for the purpose of this description that the multipath propagation has been substantially mitigated because the bore interior is densely lined with microwave antennas that have substantially matched termination.

MRI scanners use a combination of the strong constant magnetic field ($B_0$) modified by cyclical gradient fields operating in the three perpendicular directions x, y, z, and a rotating radio-frequency (RF) magnetic field ($B_1$) to excite nuclear magnetic resonance in the image subject, in this case the patient 1. The resonating nuclei generate short term RF signals that continue after the rotating radio-frequency (RF) magnetic field ($B_1$) has been removed. These short term RF signals are received to build up a tomographic image of a slice through the image subject, as will be described in more detail below.

The MRI Scanner operates by exciting resonances in the hydrogen nuclei of the scanned image subject and detecting the decay of those responses. A strong longitudinal magnetic field, $B_0$, aligns the spins of the hydrogen nuclei in one or other direction along the longitudinal direction. The surplus hydrogen nuclei whose spin is orientated with the field are excited into resonance by the temporary magnetic field, $B_1$, also referred to as the excitation pulse, which is caused to rotate around the MRI bore at an RF frequency that is proportional to the strength of the $B_0$ field. After cessation of the $B_1$ field, the nuclei continue to resonate and emit their own decaying rotating magnetic field that is manifest as an RF signal, which is detected to construct the image. The strength and the rate of decay of the signals emitted by the body provide information relating to the tissue that is being imaged.

In order to use the above process to create tomographic images, it is necessary to resolve the three dimensions of the image. Typically this is done in three separate stages. The conventional labeling of perpendicular directions is z, along the axis of the cylindrical bore; y, vertically upwards; and x, perpendicular to both y and z and for this example, dimension x refers to the direction across the body, y, vertically through the body, and z along the body, respectively. However, the discussions given in relation to these dimensions are equally applicable following any rotational transformation. The fundamental process of image element resolution is based on the use of gradient magnetic fields that can be applied linearly at any strength within limits along any, or all of the directions x, y and z. A magnetic gradient can be constructed along any other direction by a linear superposition of gradients in these directions.

The first process is to apply a magnetic gradient along the z direction during the application of the $B_1$ field. Only the nuclei that are located along the z direction, at positions where the resonant frequency, created by the combination of $B_0$ and the gradient, is equal to the $B_1$ field rotation frequency, will resonate. The effect of this is that a slice of the patient, perpendicular to the z direction is selected. After the $B_1$ field excitation has stopped, the nuclei within this slice will emit RF signals. At this stage the z direction gradient can be removed although it may be reapplied briefly in anti-phase to bring the RF signals from across the width of the slice into phase—so called re-phasing gradient. However, voxels (volume pixels) still need to be resolved over this slice. The first stage of this process is to apply a further gradient in the x direction. This direction is referred to as the frequency encoding direction. The effect of the x direction magnetic gradient is to impose a frequency ramp onto the signals from the slice along the x direction. At this stage the image has been resolved to the level of vertical (y direction) lines. The final stage of resolution is known as phase encoding. The process here is to repeat many times all the steps described so far and for each repetition to add a temporary, y direction gradient, whose amplitude changes in uniform steps from maximum negative to maximum positive (or vice versa) over the repetitions. As the y direction gradient appears only temporarily, it does not affect the frequency of the signal, but creates a phase advance or phase retard that is proportional to the distance along the y direction (according to the y gradient). The effect of this, for each y direction line (i.e. for each frequency), is to create a set of complex values that correspond to the Fourier transform elements of the signal from each point down the line.

The complete set of frequencies and phase encoding steps for each frequency are formed into a matrix that is commonly and hereinafter referred to as k-space. It can readily be understood from the foregoing description that the application of a two dimensional inverse Fourier transform to the k-space matrix provides a matrix whose elements correspond to the complex signal intensities over the x-y slice selected by the original z direction gradient.

The phase of signals in the frequency encoding direction is not critical. Moreover, there is negligible time for patient movement during a single phase encoding step. Thus, the critical impact of patient motion is in relation to the phase encoding process. Essentially the effect of patient movement is to multiply the phase encoded image data by an unknown phase and (to a lesser degree) amplitude profile. Because the phase encoded image is the Fourier transform of the actual image, this multiplication can be viewed as convolution of the image data by an unknown function corresponding to the inverse Fourier transform of the phase and amplitude variations. Thus the motion artifacts take the form of a smearing of the image according to this unknown function.

The present invention uses receivers that provide outputs for the upconverted upper sideband (USB) and lower sideband (LSB) and combines these outputs in such a way that distortion effects due to motion are substantially mitigated.

The lower sideband contains the conjugate of the baseband signal. This has the effect that phase shifts at RF are inverted with respect to the downconverted lower sideband signal. The impact of this is that, while an increase in path length results in a phase lag for the upper sideband, it causes a phase lead for the lower sideband. If both sidebands are received then their phase difference will vary with patient movement.

Figure 2:
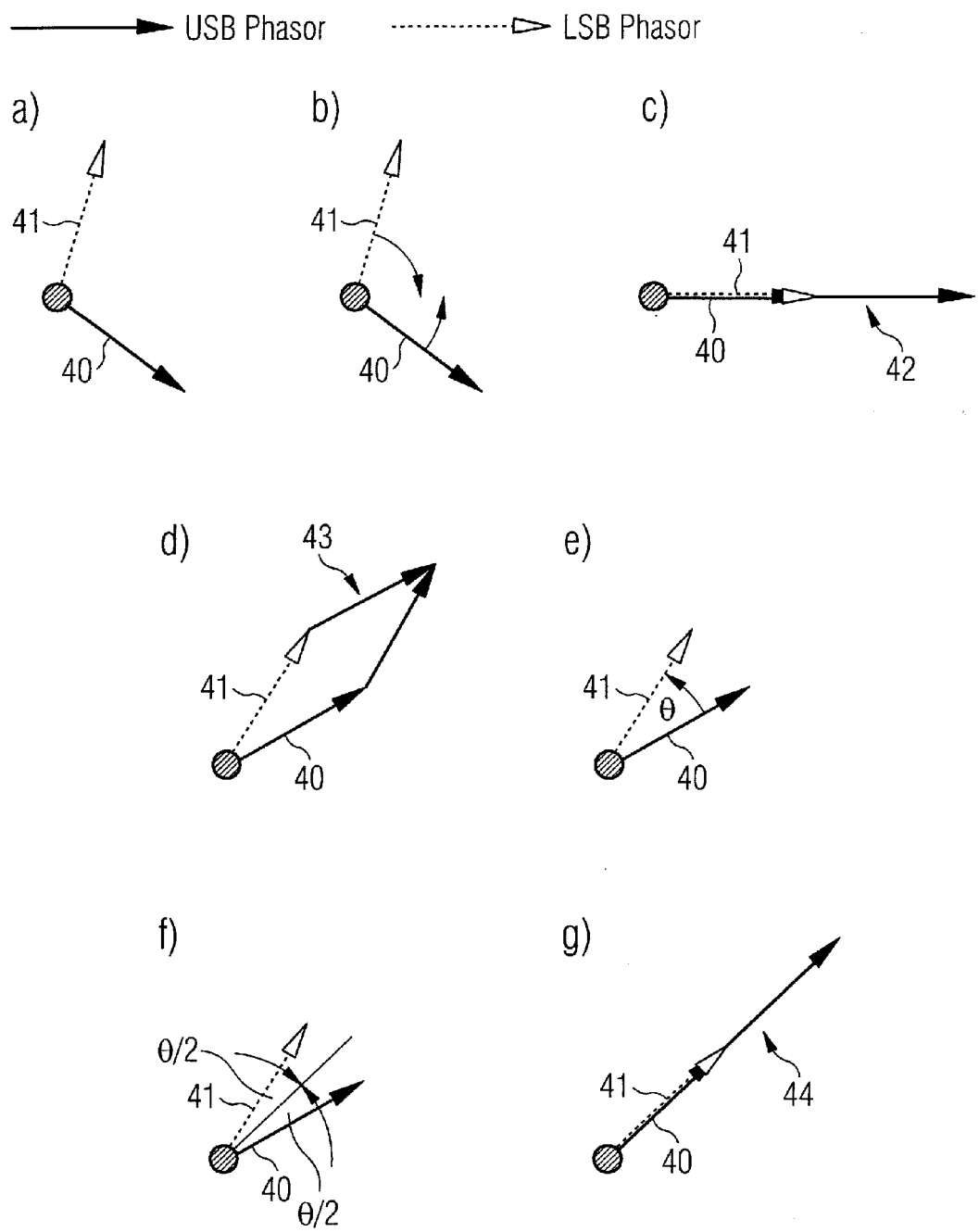
FIG. 2 uses phasor diagrams to illustrate how phase difference varies with patient movement for received inputs.

The approach is illustrated using phasor diagrams as shown in FIG. 2.

The center phase encoding step (zero phase encoding gradient) involves no phase shifts at all. Thus, signals from all pixels along a line in the phase encoding direction are nominally in phase. However the microwave radio path will introduce arbitrary phase shifts on both upper and lower sidebands.

In FIG. 2a, the phase shifts necessary to bring upper and lower sideband phasors 40, 41 nominally to real are applied. In an alternative and preferred embodiment, the measured phase difference between USB and LSB corresponding to the centre phase encoding step is computed and either added to the LSB by multiplication by a unity length phasor having that phase or subtracted from the USB by multiplication by a unity length phasor having minus that phase. This brings the USB and LSB into the same nominal phase. Such phase adjustment can be applied by addition to the USB and subtraction from the LSB of any suitable proportions of the measured phase difference between the USB and LSB. The overall absolute phase for phase encoding does not matter. Thus the application, seen in FIG. 2a of an effective additional phase shift that brings both phases to the real axis is immaterial. In FIG. 2b the phasors 40, 41 are added together to maximize signal to noise ratio (SNR), with the resultant 42 shown in FIG. 2c. It is assumed that the phase adjustments shown in FIG. 2b have been applied transparently to all subsequent signals. If there were no patient movement, these phase adjustments would be suitable to allow addition of the USB and LSB in a maximal ratio sense.

By the time of the second phase encoding step, the patient may have moved. The actual (true) phase for this step is arbitrary and will be different for each frequency along the frequency encoding direction. In FIG. 2d an example of this is shown as 45°. However, because the movement of the patient has changed the path length, the phasors 40, 41 will have moved slightly away from the correct value of 45°, one in one direction, the other in the other. If simply using one phasor (e.g. the upper sideband 40) this phase shift will distort the image—this corresponds to the uncompensated case. However, an improvement can be achieved very simply by adding the two phasors 40, 41 together 43 as in FIG. 2d, showing, the correct phase of the signal has been recovered—this illustrates the use of passive compensation. Steps 2a to 2d providing passive compensation may be more robust in the case where there is a lot of interference from different local coil signals of overlapped images, so it is ambiguous working out what is actually a change in phase. The change in phase depends upon path geometry. It is desirable to apply one correction phase for phase decoding, but a signal running across several coils does not have a single phase correction.

However, in the above case, the length of the resultant phasor 43 in FIG. 2d is shorter than it should be. This effect can be mitigated using active compensation. First, the phase shift between the upper and lower sidebands, θ, is determined as illustrated in FIG. 2e. This is done by multiplying each of the upper sideband values by the complex conjugate of the corresponding lower sideband values and taking the average. The argument of this value gives an estimate of θ. Next the upper and lower sideband elements are all multiplied by $\exp(-j\theta/2)$ and $\exp(j\theta/2)$ respectively to bring them into nominal phase with each other, whilst preserving the underlying phase, as shown in FIG. 2f. Finally the compensated phasors are added together to produce a resultant 44 that should be correct in phase and amplitude, shown in FIG. 2g.

Active compensation works to align the phases of the two sidebands. Once this has been done the actual weights used to combine them can be derived from the normal mechanisms used for maximal ratio combining (possibly including the impact of the noise correlation matrix). In principle, the weights could be allowed to be very different. In practice, the quality of the active compensation depends on the quality of the phase difference estimates. To the degree that the estimate is poor, the simple combining of FIG. 2d serves to correct any residual phase error.

This process is applied for every receiver output. For each receiver in its transceiver 9, the outputs of this process are then available for combining as appropriate with the outputs of the process for other receivers according, for example, to sum of squares combining.

The basic algorithms are expressed more rigorously below. In the following we assume that the underlying k-space is defined by a matrix, S, with elements $s_{i,j}$, with i,j. {0,N−1} where N is the number of pixels in both dimensions. The frequency encoding direction (initially taken to be horizontal) is along the rows and the phase encoding direction (vertical) is down the columns. The elements of S are taken to have been stored in time order using symmetrical gradients. The received k-space versions on the USB and LSB are $S^U$ and $S^L$ with elements $s_{i,j}^U$ and $s_{i,j}^L$ respectively.

In order to carry out passive compensation, first a global compensation of the phase difference between USB and LSB at the DC component of the spatial spectrum in the phase encoding direction is performed. This is done by measuring the mean phase difference between the $N/2^{th}$ row of $S^U$ and $S^L$. Let $$M_l = \sum_{j=0}^{N-1} s_{l,j}^U s_{l,j}^{L*}$$

and $\phi_l^{UL} = \angle M_l$. Then the weighted mean phase difference between USB and LSB for the $N/2^{th}$ row is $\phi_{N/2}^{UL}$. Then the phase of the lower sideband is adjusted to bring it nominally into line with that of the upper sideband by performing the adjustment: $s^L \leftarrow s^L \cdot \exp(j\phi_{N/2}^{UL})$ or more simply $$s^L \leftarrow s^L \cdot \frac{M_{N/2}}{|M_{n/2}|}.$$

Then the original $S^U$ is simply added to the modified $S^L$.

Active Compensation is carried out by first performing the phase alignment described for passive compensation. In the following, $S^L$ will refer to the modified version. Then measure the mean phase differences for all rows of $S^U$ and $S^L$ individually. For this one option is to simply use $\phi_i^{UL}$ for all the values of i (these would, of course, need to be computed after the phase adjustment of $S^L$). However, this approach is potentially subject to phase wrapping for large patient movements. In order to mitigate this effect, the differences between successive values of $\phi_i^{UL}$: $\phi_{i+1}^{UL} - \phi_i^{UL} = \angle \{M_{i+1} \cdot M^*_i\}$ were estimated and accumulated symmetrically outwards from the central ($N/2^{th}$) row. The above approach is only applied if the pattern of movement is expected to be smooth. Otherwise the simpler direct approach using $\phi_i^{UL} \leftarrow M_i$ is applied. Taking the phase difference estimates (however obtained) and denoting them, once more as $\phi_i^{UL}$, then $S^U$ and $S^L$ is modified element by element as follows: $s_{i,j}^U \leftarrow s_{i,j}^U \cdot \exp(-j\phi_i^{UL}/2)$ and $s_{i,j}^L \leftarrow s_{i,j}^L \cdot \exp(j\phi_i^{UL}/2)$. The modified k-space matrices are then simply added together.

The above algorithm works well where only a single local coil is present. However, where multiple local coils are present, the signals received from more than one local coil at a bore receiver can interfere, degrading the quality of the motion signal for at least some of the positions in the image. In order to mitigate this effect an extension to the process is proposed in which the motion compensation is specific to each phase encoded line.

Figure 3:
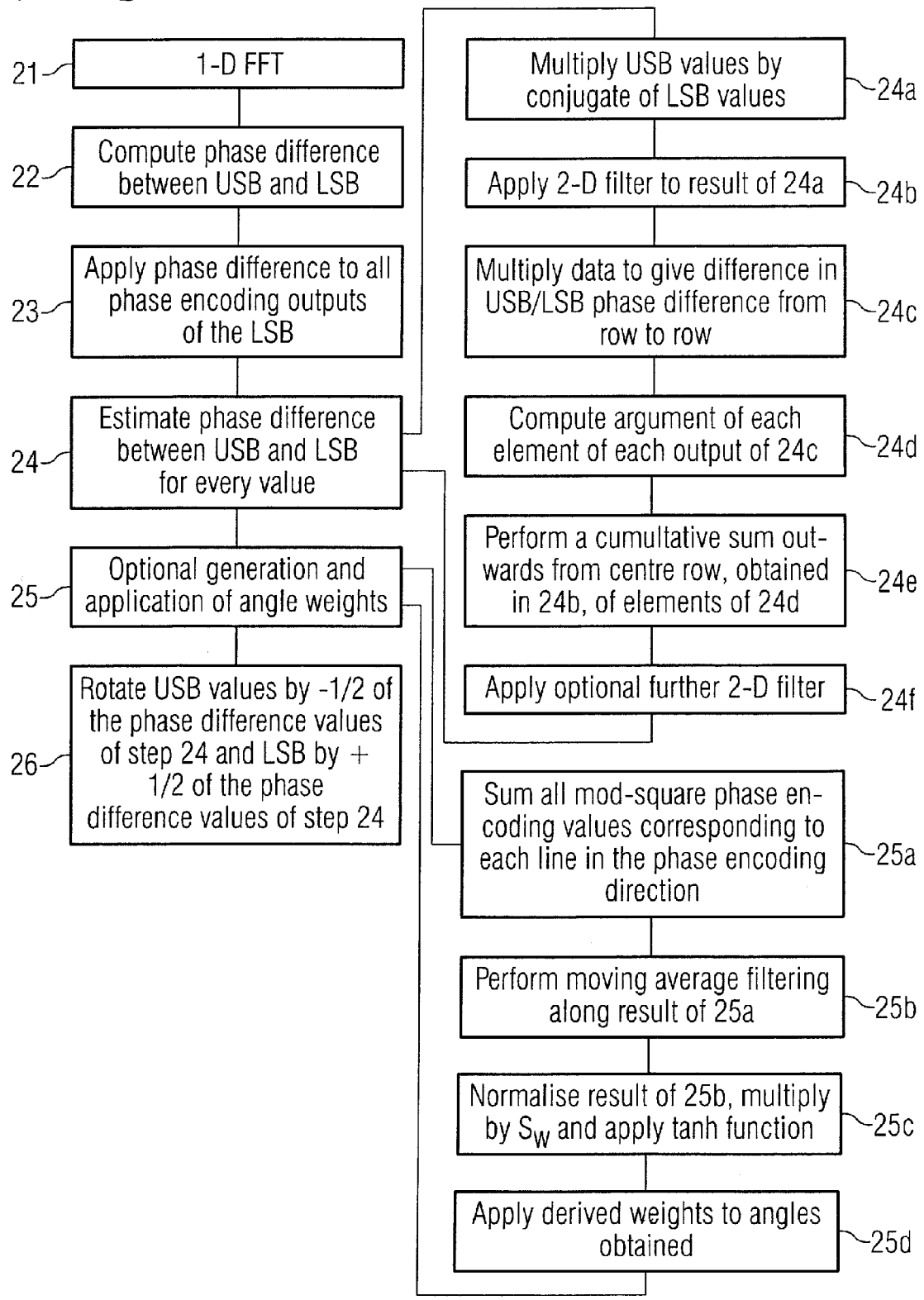
FIG. 3 is a flow diagram of an example of the method of motion compensation according to the invention.

The details of the motion compensation process for multiple local coils are illustrated in the flow diagrams of FIGS. 3 and 4 as follows. A one dimensional fast Fourier transform (FFT) is performed 21 along the frequency encoding, x, direction independently for the USB and LSB. This separates out the lines in the frequency direction. The phase differences between USB and LSB are computed 22 for the central (DC) phase encoding output along the frequency encoding direction. This is done by multiplying the USB values by the conjugate of the LSB values, applying moving average filtering with average length $n_{ip}$, then applying the argument function to obtain the actual phase differences.

The phase differences between the USB and LSB are applied 23 to all phase encoding outputs of the LSB, so that the first phase encoding steps of USB and LSB are nominally in phase and all the others remain consistent. This step aligns the 'nominal' phases of the USB and LSB for combining. Without motion compensation it would be part of normal maximal ratio combining. It is equivalent to the step of FIG. 2b.

This process also allows the steps of FIGS. 2c and 2d to be performed. Thus, adding the USB and LSB at this stage corresponds to passive compensation and if passive compensation is all that is required, the process stops here for this case.

Next, the phase difference between USB and LSB is estimated 24 for every value. This is essentially as described earlier with respect to the examples of FIG. 2, but with additional averaging and weighting. The estimation comprises the following steps. The USB values are multiplied 24a by the conjugate of the LSB values. In principle the argument of these values gives the phase differences. In practice they would be very noisy and potentially subject to phase wrapping. The next step therefore is to apply 24b a two dimensional filter to the result of 24a, in the frequency encoding, x and phase encoding, y directions. For example, a rectangular moving average filter may be used, or alternatively a Savitzky Golay filter. In order to avoid phase wrapping each row of data is multiplied 24c, by the phase conjugate of the elements of the previous row, starting with the second row. This gives the differences in USB/LSB phase differences from row to row. The argument of each element of the output of 24c is computed 24d, then any unexpected phase shifts—those with magnitude greater than π/2—are filtered out by setting them to zero. A cumulative sum is performed 24e, working outwards from the centre row obtained in 24b of the elements of 24d. This gives the unwrapped phase. Optionally a further two dimensional filter may be applied 24f to the result of 24a, with average length $n_{pdf2}$ in the frequency encoding direction and average length $n_{pdp2}$ in the phase encoding direction. This further smoothes the data. These phase difference estimation steps correspond to the step of FIG. 2e.

The next step 25 is optional, involving generating and applying angle weights. In this case, all the mod-square phase encoding values corresponding to each line in the phase encoding direction are summed 25a independently for USB and LSB and added together. Then a moving average filtering is performed 25b along the result of 25a with average length $n_w$. The averaging is symmetrical about each point except at the edges where the rectangle is clipped as necessary to account for the absent values beyond the edge and scaled accordingly. The results of 25b are normalized 25c, so that the peak value is unity, then multiplied by $s_w$ before applying to a tan h function. This produces values that are typically unity for relatively high levels, but that might fall for lower values. These values are used to avoid applying unreliable phase corrections and making the image worse. The weights derived in steps 25a to 25c are applied 25d to the angles obtained. The same weight is applied for all angles corresponding to any phase encoded line.

Finally, the USB values are rotated 26 by minus one half of the phase difference values obtained in step 24 and the LSB values are rotated by plus one half of the phase difference values obtained in step 24, then added together.

The performance can be significantly improved by generating a 'master' motion compensation signal from all of the available measurements and applying appropriately scaled copies of this for motion compensation wherever appropriate. The process operates as illustrated in the flow diagram of FIG. 4. A master phase difference profile is obtained 31 by averaging over the outputs of all lines and all receiver outputs. This provides a good representation of the actual motion profile. A determination is made 32 of whether or not motion compensation is required. For example, if the peak phase shift associated with the master phase difference is small (e.g. less than, perhaps, 5°), then there is negligible motion and motion compensation is not required, so nothing further is done 33.

Otherwise, in the case where motion compensation is required, then for every line and every receiver output, the master phase difference is correlated 34 against the measured phase difference to determine the necessary scaling of the master phase difference to replicate the measured phase difference. However, under some circumstances this algorithm might fail. Firstly, if the correlation is very small—i.e. if the measured phase difference is predominantly created by interfering signals—then the algorithm may erroneously call for a very large scaling factor. Alternatively, even if the scaling is not excessively large, the effective replication of the measured phase difference might fail. Two tests are applied to cover these conditions. Firstly, if the scaling called for is higher than is geometrically possible 35a, then no compensation is applied 35b for this case. Secondly, if the relative mean square error in replicating the measured phase difference is greater than 25% 35c, then no compensation is applied 35d for that case either. Having carried out these tests, then the appropriate scalings are applied 36 to the master phase difference profile and used to compensate the phases of USB and LSB as before.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of compensating for the effects of motion of an image subject during magnetic resonance imaging using phase encoding in a magnetic resonance imaging system comprising a plurality of wireless local coils and a wireless microwave transceiver array; the method comprising:
    carrying out one or more phase encoding steps to derive one or more magnetic resonance signals in the wireless coils;
    upconverting the signals from the phase encoding steps to generate upper and lower sidebands of the magnetic resonance signals;
    transmitting the upconverted upper and lower sideband signals to the microwave array;
    deriving signals from the upper and lower sidebands;
    determining a representative phase difference between the signals derived from the upper and lower sidebands from one or more of the phase encoding steps;
    applying the representative phase difference to each pair of derived signals for every phase encoding step to produce phase compensated signal pairs;
    such that the pair of signals are moved more closely into phase.

2. A method according to claim 1, wherein production of phase compensated signal pairs further comprises moving the signals derived from the lower sideband more closely into phase with the signals derived from the upper sideband by multiplying complex signal representations of the signals derived from the lower sideband by a unity length phasor with phase equal to the representative phase difference.

3. A method according to claim 1, wherein production of phase compensated signal pairs further comprises moving the signals derived from the upper sideband more closely into phase with the signals derived from the lower sideband by multiplying complex signal representations of the signals derived from the upper sideband by a unity length phasor with phase equal to minus the representative phase difference.

4. A method according to claim 1, wherein production of phase compensated signal pairs further comprises moving the signals derived from the upper sideband more closely into phase with the signals derived from the lower sideband by multiplying complex signal representations of the pairs of signals derived from the upper sideband and lower sideband by unity length phasors with phases whose difference sums to the representative phase difference.

5. A method according to claim 1, wherein the method further comprises estimating a phase difference between the signal pairs derived from the upper sideband and lower sideband for each of the phase encoding steps.

6. A method according to claim 5, wherein estimating the phase difference for every value comprises multiplying the upper sideband values by a conjugate of the lower sideband values; applying a 2 D filter to the multiplied values; determining a change in phase difference from row to row; calculating the argument of each element of each change in phase difference; and performing a cumulative sum of the arguments.

7. A method according to claim 6, wherein the estimation further comprises applying a 2-D filter to the cumulated sum.

8. A method according to claim 1 further comprising bringing the signal pairs into phase for each of the phase encoding steps.

9. A method according to claim 8, wherein the signal pairs are brought into phase for each of the phase encoding steps by multiplying the complex signal representations of the phase compensated signal derived from the upper sideband by a unity length phasor with phase equal to plus one half of the estimated phase difference for that phase encoding step and multiplying the complex signal representation of the phase compensated signal derived from the lower sideband by a unity length phasor with phase equal to minus one half of the estimated phase difference for that phase encoding step.

10. A method according to claim 8, wherein the phase compensated signal pairs are summed.

11. A method according to claim 10, comprising measuring the ratio of the powers of the phase compensated signal pairs; and applying scaling to the signals, based on the square root of the power ratio, to produce a pair of power scaled signals, having equal powers prior to summation.

12. A method according to claim 9 further comprising generating and applying angle weights.

13. A method according to claim 12, wherein the step of generating and applying angle weights comprises summing all mod-square phase encoding values corresponding to each line in the phase encoding direction; performing moving average filtering of the sum; and normalizing the filtered sum multiples.

* * * * *